(12) United States Patent
Fehrer et al.

(10) Patent No.: US 7,588,998 B2
(45) Date of Patent: Sep. 15, 2009

(54) METHOD FOR PRODUCING A SEMICONDUCTOR ELEMENT

(75) Inventors: Michael Fehrer, Bad Abbach (DE); Berthold Hahn, Hemau (DE); Volker Härle, Laaber (DE); Stephan Kaiser, Regensburg (DE); Frank Otte, Hannover (DE); Andreas Plössl, Regensburg (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 244 days.

(21) Appl. No.: 10/503,042

(22) PCT Filed: Jan. 30, 2003

(86) PCT No.: PCT/DE03/00260

§ 371 (c)(1),
(2), (4) Date: May 14, 2005

(87) PCT Pub. No.: WO03/065420

PCT Pub. Date: Aug. 7, 2003

(65) Prior Publication Data

US 2005/0239270 A1    Oct. 27, 2005

(30) Foreign Application Priority Data

Jan. 31, 2002  (DE)  ................. 102 03 795
Sep. 20, 2002  (DE)  ................. 102 43 757

(51) Int. Cl.
*H01L 21/30* (2006.01)
(52) U.S. Cl. ............. 438/458; 438/455; 257/E21.211

(58) Field of Classification Search ............ 438/458; 257/E21.211
See application file for complete search history.

(56) References Cited

U.S. PATENT DOCUMENTS

| 4,159,214 A | * | 6/1979 | Mason ................. 117/97 |
| 4,749,840 A | | 6/1988 | Piwczyk |
| 5,300,756 A | | 4/1994 | Cordingley |
| 5,326,424 A | | 7/1994 | Doll et al. |
| 5,625,202 A | | 4/1997 | Chai |
| 5,674,758 A | | 10/1997 | McCarthy |

(Continued)

FOREIGN PATENT DOCUMENTS

CN    1200560    12/1998

(Continued)

OTHER PUBLICATIONS

L. Maricuui et al., "Lateral growth control in excimer laser crystallized polysilicon", Thin Solid Films, vol. 337, pp. 137-142, 1999.

(Continued)

*Primary Examiner*—Alexander G Ghyka
*Assistant Examiner*—Angel Roman
(74) *Attorney, Agent, or Firm*—Cohen Pontani Lieberman & Pavane LLP

(57) ABSTRACT

A method for producing a semiconductor component, in particular a thin-film component, a semiconductor layer being separated from a substrate by irradiation with a laser beam having a plateaulike spatial beam profile. Furthermore, the semiconductor layer, prior to separation, is applied to a carrier with an adapted thermal expansion coefficient. The method is suitable in particular for semiconductor layers containing a nitride compound semiconductor.

31 Claims, 7 Drawing Sheets

U.S. PATENT DOCUMENTS

| | | | |
|---|---|---|---|
| 5,838,870 | A | 11/1998 | Soref |
| 5,998,291 | A | 12/1999 | Bakhit et al. |
| 6,071,795 | A * | 6/2000 | Cheung et al. .............. 438/458 |
| 6,111,276 | A | 8/2000 | Mauk |
| 6,135,645 | A | 10/2000 | Grötsch |
| 6,136,141 | A * | 10/2000 | Glatfelter et al. ......... 156/380.9 |
| 6,169,298 | B1 | 1/2001 | Lin et al. |
| 6,181,855 | B1 | 1/2001 | Richter et al. |
| 6,280,523 | B1 * | 8/2001 | Coman et al. ............... 117/101 |
| 6,287,882 | B1 | 9/2001 | Chang et al. |
| 6,300,224 | B1 | 10/2001 | Arima et al. |
| 6,331,208 | B1 * | 12/2001 | Nishida et al. ................ 117/89 |
| 6,365,429 | B1 | 4/2002 | Kneissl et al. |
| 6,372,608 | B1 * | 4/2002 | Shimoda et al. ............. 438/455 |
| 6,504,180 | B1 | 1/2003 | Heremans et al. |
| 6,559,075 | B1 * | 5/2003 | Kelly et al. ................. 438/795 |
| 6,740,604 | B2 | 5/2004 | Kelly et al. |
| 6,814,832 | B2 * | 11/2004 | Utsunomiya ............... 156/230 |
| 6,902,098 | B2 | 6/2005 | Dautartas |
| 6,958,093 | B2 * | 10/2005 | Vaudo et al. .................. 117/90 |
| 2002/0102830 | A1 | 8/2002 | Ishida |
| 2003/0190794 | A1 | 10/2003 | Ohmi et al. |
| 2006/0220042 | A1 * | 10/2006 | Yaegashi et al. .............. 257/94 |
| 2007/0228395 | A1 * | 10/2007 | Kamiyama et al. ............ 257/79 |

FOREIGN PATENT DOCUMENTS

| | | |
|---|---|---|
| CN | 1318206 | 10/2001 |
| DE | 43 24 318 C1 | 1/1995 |
| DE | 195 46 443 A1 | 6/1997 |
| DE | 196 40 594 A1 | 4/1998 |
| DE | 197 06 279 A1 | 8/1998 |
| DE | 198 21 544 A1 | 12/1999 |
| DE | 100 56 645 A1 | 9/2001 |
| DE | 103 03 978 A1 | 1/2003 |
| DE | 102 03 795 A1 | 8/2003 |
| EP | 0 247 331 A | 12/1987 |
| EP | 0 867 919 A2 | 3/1998 |
| EP | 0 553 860 A2 | 1/2003 |
| JP | 2000 196197 | 11/2000 |
| TW | 409295 | 10/2000 |
| WO | WO 95/03628 | 2/1995 |
| WO | WO 98/14986 | 4/1998 |
| WO | WO 03/065420 A2 | 8/2003 |

OTHER PUBLICATIONS

C.T. Angelis, et al., "Effect of excimer laser annealing on the structural and electrical properties of polycrystalline silicon thin-film transistors", Journal of Applied Physics, vol. 86, No. 8, pp. 4600-4606, Oct. 1999.

Yong-Feng Lu et al., "Excimer-Laser Removal of $SiO_2$ Patterns from GaAs Substrates", Jpn. Journal of Applied Physics, vol. 33, No. 3A, Part 2, pp. L324-L327.

M.K. Kelly, et al., "Optical patterning of GaN films", Applied Physics Letters ISSN 0003-6951, vol. 69, No. 12, pp. 1749-1751, 1996.

Laser Beam Homogenizer, Laser-Laboratorium Gottingen e.v., Technisches Datenblatt, 1995.

Wong et al., "Structural and Optical Quality of GaN/Metal/ SI Heterostructures Fabricated by Excimer Laser Lift-Off", Applied Physics Letters, American Institute of Physics, New York, vol. 75, No. 13, Sep. 1999.

Toet et al., "Thin-Film Transistors Fabricated in Printed Silicon" Japanese Journal of Applied Physics, vol. 38, No. 10A, Oct. 1999.

Angelis, et al., "Electrical and Noise Properties of Thin-Film Transistors on Very Thin Excimer Laser Annealed Polycrystalline Silicone Films", Applied Physics, American Institute of Physics, New York, Bd. 74, Nr. 24.

Huggins C.R. et al., "Ultrathin GaAs Solar Cells Germanium Substrates", Proceedings of the photovoltaic specialists conference, IEEE, US, Bd. 2 Conf. 22, 7, Las Vegas, Oct. 1991.

I. Schnitzer et al., "30% external quantum efficiency from surface textured LEDs", Applied Physics Letters, Oct. 1993, vol. 63, pp. 2174-2176.

W.S. Wong, et al.: "$In_xGa_{1-x}N$ light emitting diodes on Si substances fabricated by PD—In metal bonding and laser lift-off", Applied Physics Letters, vol. 77, No. 18, Oct. 30, 2000.

* cited by examiner

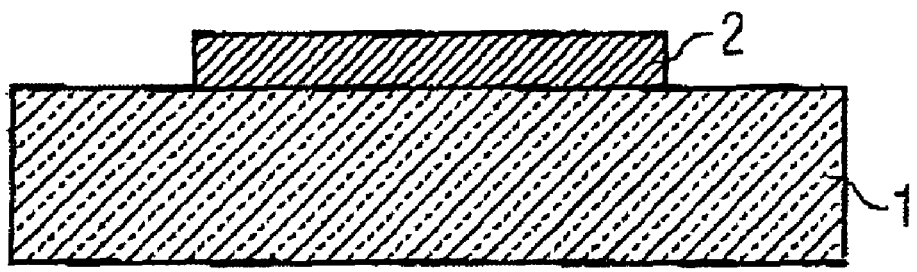
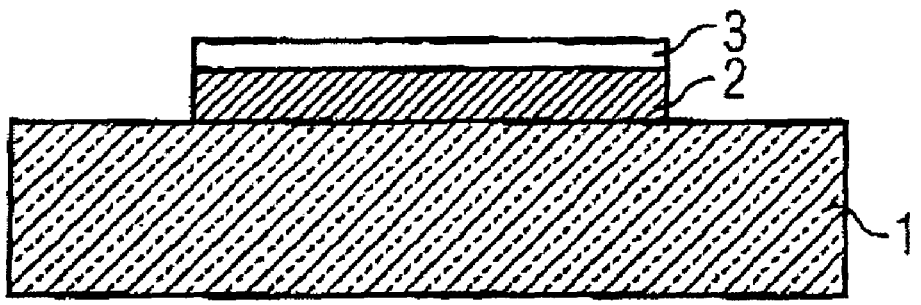
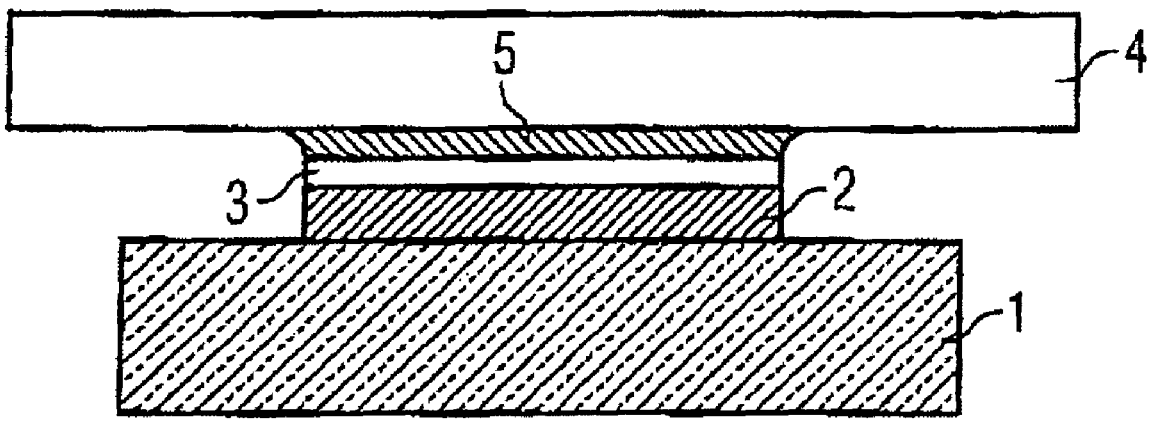

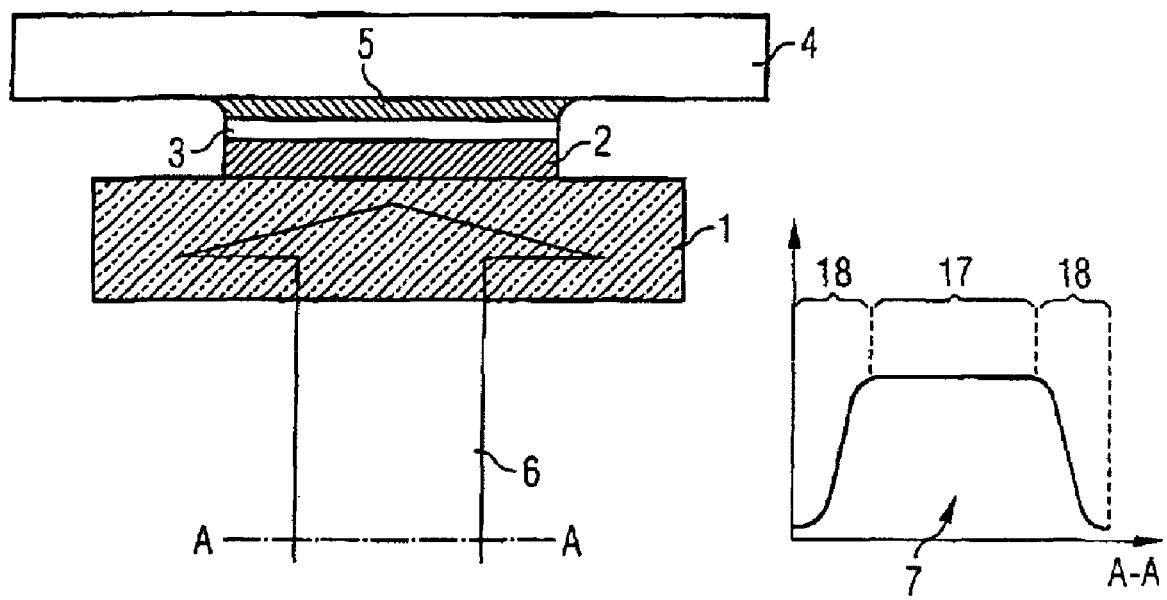
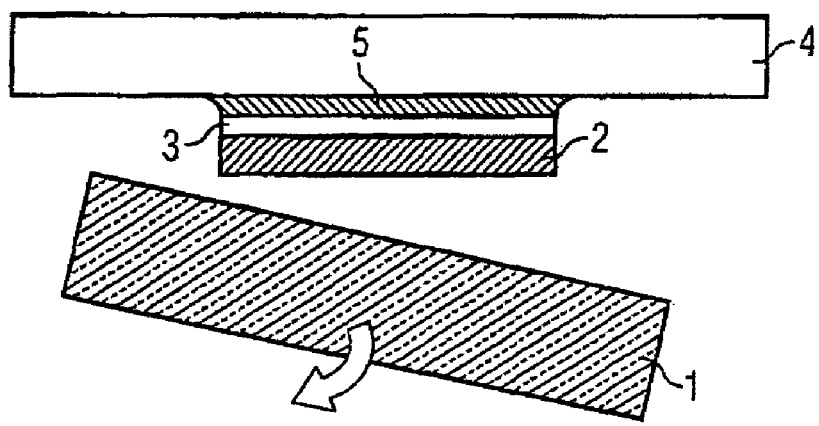

METHOD FOR PRODUCING A SEMICONDUCTOR ELEMENT

RELATED APPLICATIONS

This is a U.S. national stage of application No. PCT/DE03/00260, filed on Jan. 30, 2003.

This patent application claims the priority of German patent application nos. 102 03 795.7, filed Jan. 31, 2002 and 102 43 757.2, filed: Sep. 20, 2002 the disclosure contents of which are hereby incorporated by reference.

FIELD OF THE INVENTION

The invention relates to a method for producing a semiconductor component, in which a semiconductor layer is separated from a substrate by irradiation with a laser beam.

BACKGROUND OF THE INVENTION

A method of this type is used for example in the production of substrateless luminescence diodes based on GaN. Such components contain a semiconductor body and a carrier part, on which the semiconductor body is fixed. In order to produce the semiconductor body, firstly a semiconductor layer is fabricated on a suitable substrate, subsequently connected to a carrier and then stripped away from the substrate. Dividing up, for example sawing up, the carrier with the semiconductor layer arranged thereon produces a plurality of semiconductor bodies which are in each case fixed on the corresponding carrier part. What is essential in this case is that the substrate used for producing the semiconductor layer is removed from the semiconductor layer and does not simultaneously serve as a carrier or carrier part in the component.

This production method has the advantage that different materials are used for the substrate and the carrier. The respective materials can thus be adapted, largely independently of one another, to the various requirements for the production of the semiconductor layer, on the one hand, and the operating conditions, on the other hand. Thus, the carrier can be chosen in accordance with its mechanical, thermal and optical properties independently of the requirements made of the substrate for the fabrication of the semiconductor layer.

The epitaxial production of a semiconductor layer, in particular, makes numerous special requirements of the epitaxial substrate. By way of example, the lattice constants of the substrate and of the semiconductor layer to be applied have to be adapted to one another. Furthermore, the substrate should withstand the epitaxy conditions, in particular temperatures of up to in excess of 1000° C., and be suitable for the epitaxial accretion and growth of an as far as possible homogeneous layer of the relevant semiconductor material.

By contrast, other properties of the carrier such as, by way of example, electrical and thermal conductivity and also radiation transmissivity in the case of opto-electronic components come to the fore for the further processing of the semiconductor body and operation. Therefore, the materials suitable for an epitaxial substrate are often only suitable to a limited extent as carrier part in the component. Finally, it is desirable, particularly in the case of comparatively expensive epitaxial substrates such as silicon carbide substrates, for example, to be able to use the substrates repeatedly.

The stripping-away of the semiconductor layer from the substrate is essential for the aforementioned production method. Said stripping-away can be achieved by irradiating the semiconductor-substrate interface with laser radiation. In this case, the laser radiation is absorbed in the vicinity of the interface, where it effects decomposition of the semiconductor material.

The semiconductor layer may be separated from the substrate for example by means of laser stripping, as described in U.S. Pat. No. 6,559,075. In this case, the frequency-tripled radiation of a Q-switch Nd:YAG laser at 355 nm is used for stripping GaN and GaInN layers from a sapphire substrate. The sapphire substrate is transparent to radiation at this wavelength. The radiation energy is absorbed in a boundary layer having a thickness of approximately 100 nm at the junction between the sapphire substrate and the GaN semiconductor layer. At pulse energies of above 200 mJ/cm$^2$, temperatures of more than 850° C. are reached at the interface. The GaN boundary layer decomposes at this temperature to liberate nitrogen, and the bond between the semiconductor layer and the substrate is separated.

In the case of a method of this type, there is the risk of substrate residues adhering on the semiconductor layer on account of incomplete material decomposition during the stripping away of the semiconductor layer. By way of example, microscopic sapphire grains, so-called "flakes", are often found on a GaN layer separated from a sapphire substrate in this way.

The diameter of these sapphire residues typically lies between 5 μm and 100 μm. The sapphire residues make further processing of the semiconductor layer more difficult and require a comparatively high effort to remove them on account of the high mechanical and chemical resistance of sapphire. This may have the effect that only parts of the stripped-away semiconductor layer can continue to be used or the entire layer even becomes unusable.

Generally, a mechanical stabilization of the semiconductor layer to be stripped away is necessary since the layer thickness is so small that otherwise there is the risk of damage, in particular a break or crack in the layer. By way of example, a connection of the semiconductor layer, which may also already be partly processed, to the carrier by means of a material joint is suitable for the purpose of mechanical stabilization. Such a connection should be thermostable at least to an extent such that it withstands without damage the temperatures that occur during subsequent fabrication steps. Furthermore, said connection should also remain stable in the event of alternating temperature loads which may occur, in particular, during operation of the component.

Adhesives are often used for fixing the semiconductor layer on the carrier. In the case of relatively high electrical powers, problems may result in this case on account of the limited thermal and electrical conductivity of adhesives. The limited thermal endurance of such adhesive connections additionally limits the permissible temperature range of a corresponding component and consequently the maximum possible power loss.

SUMMARY OF THE INVENTION

It is an object of the present invention to develop an improved method for producing a semiconductor component in which a semiconductor layer is separated from a substrate by means of laser irradiation.

This and other objects of the invention are attained in accordance with one aspect of the invention directed to a method for producing a semiconductor component, in which a semiconductor layer is separated from a substrate by irradiation with a laser beam, wherein the laser beam has a plateaulike spatial beam profile.

In a particular embodiment, the laser beam can have a rectangular or trapezoidal beam profile. This beam profile significantly reduces the number of substrate residues on the semiconductor layer in comparison with a conventional separation method.

A plateaulike beam profile is to be understood to be a transversal intensity distribution of the laser beam which has a central region with an essentially constant intensity distribution adjoined in each case by a flank with falling intensity. Preferably, the relative fluctuation of the beam intensity in the central region is less than 5 percent.

In order to further improve the beam profile, a beam homogenizer may be arranged downstream of the laser. Furthermore, it is expedient to use a suitable optical arrangement, for example a lens system which may comprise correction lenses, attenuators, mirrors, mask structures and/or projection lenses, for imaging the laser beam onto the semiconductor layer. In this way, it is possible to set the energy density required for material decomposition without impairing the advantageous beam profile.

By contrast, the lasers used in conventional laser separation methods generally have a Gaussian beam profile. This leads to a spatially comparatively greatly varying, inhomogeneous field distribution on the semiconductor-substrate interface and consequently to varying degrees of material decomposition. During the subsequent stripping-away of the semiconductor layer, there is the risk of substrate residues adhering on the semiconductor layer at locations of weak or incomplete material decomposition.

Preferably, in the case of the invention, the laser beam is generated by an excimer laser. Excimer lasers generally have a plateaulike, often trapezoidal or rectangular, beam profile. Furthermore, particularly in the case of excimer lasers with a noble gas-halogen compound as laser medium, the emission wavelength lies in the ultraviolet spectral range, which is particularly suitable for stripping away nitride compound semiconductors. Moreover, the pulse peak power in the case of excimer lasers, which typically lies between 1 kW and 100 MW, is so high that even in the event of mask imagings of the laser beam and after passage through a plurality of lenses, the energy density suffices for material decomposition.

In order to achieve the beam intensity required for the material decomposition, a pulsed operation is expedient for the laser. In comparison with a laser in continuous wave operation, this also reduces the risk of overheating of the semiconductor layer that is to be stripped away. In the case of a pulsed laser, the transporting-away of the heat arising as a result of the laser irradiation can be set optimally through a suitable choice of pulse duration and pulse spacing.

In the case of semiconductor layers with a relatively large lateral extent, it is advantageous for individual regions of the semiconductor layer that are arranged next to one another to be irradiated successively, in order to avoid an excessively large expansion of the beam area. Since, for a given beam power or energy of the laser pulse, the intensity decreases as the beam area increases, it is possible, in the event of excessively great beam expansion, for the decomposition threshold, i.e. the energy density required for the material decomposition, to be undershot and complete stripping-away of the semiconductor layer to be impaired.

In this case, it is particularly advantageous to guide the laser beam and/or the substrate with the semiconductor layer situated thereon such that the irradiated individual regions produce an area-filling overall arrangement. An approximately constant spatial intensity distribution for the predominant part of the irradiated area corresponds to this in a manner integrated with respect to time, i.e. over the irradiation time period. On account of this approximately constant intensity distribution, the stripped-away semiconductor layer has an advantageously small number of substrate residues or is even free of residues. A plateaulike, in particular rectangular, spatial beam profile is particularly advantageous for the above-mentioned area-filling overall arrangement of the irradiated individual regions.

In a preferred development of the invention, the laser beam has, at the location of the semiconductor layer or the semiconductor-substrate interface, a beam area with a longitudinal dimension and a transverse dimension, the longitudinal dimension being significantly greater than the transverse dimension. Preferably, the longitudinal dimension exceeds the transverse dimension by a factor of 5 to 10, thus producing a linear or striplike beam area.

The semiconductor layer is moved during irradiation in a parallel direction with respect to the transverse dimension, so that, during irradiation, the linear or striplike beam area sweeps over the entire semiconductor layer to be stripped away. In this case, too, an advantageously constant intensity distribution of the irradiated semiconductor layer results in a manner integrated over the irradiation time period, a further advantage consisting in the fact that a simple linear movement of the semiconductor layer relative to the laser beam suffices. It goes without saying that this involves a relative movement between semiconductor layer and laser beam which can be realized both by means of a movement of the semiconductor layer with a stationary laser beam and by means of a corresponding guidance of the laser beam with a stationary semiconductor layer.

In the case of the invention, it is advantageous to irradiate the direct interface region between semi-conductor layer and substrate with the laser radiation, so that the radiation energy is absorbed near the interface and leads to a material decomposition there. This may be achieved by virtue of the fact that the substrate is transmissive to the laser radiation and the semiconductor layer is irradiated through the substrate. In the case of this arrangement, the absorption of the laser radiation is generally significantly greater in the semiconductor layer than in the substrate, so that the laser beam penetrates through the substrate virtually without any losses and is absorbed on account of the high absorption near the interface in the semiconductor layer.

It should be noted that the radiation absorption need not necessarily be effected at the location of material decomposition. The material decomposition may also be effected by the radiation firstly being absorbed at a different location and then the absorbed radiation energy being transported to the location of material decomposition. If appropriate, the radiation could also be absorbed in the substrate and the radiation energy could subsequently be transported to the semiconductor layer.

A further aspect of the invention is directed to a method for producing a semiconductor component, in which a semiconductor layer is separated from a substrate by means of a laser beam. Prior to separation, the semiconductor layer is applied, preferably soldered, onto a carrier by the side remote from the substrate. A soldered connection is distinguished by a high thermal and electrical conductivity in comparison with conventional adhesive connections.

The separation itself is preferably effected according to one of the methods already described. It goes without saying that although a soldered connection is advantageous in the case of the separation methods described previously, an adhesive-bonding connection between carrier and semiconductor layer also lies within the scope of the invention.

The solder used is preferably a gold-containing solder, for example a gold-tin solder. Gold-tin solders having a high proportion of gold, for example between 65% by weight and 85% by weight, are particularly preferred in this case.

The melting point of such a solder is typically 278° C. and is thus greater than the temperature which usually arises during the soldering of an electrical component. Thus, by way of example, the soldering temperature in the course of soldering onto a printed circuit board is generally less than 260° C. This prevents the semiconductor body from being stripped away from the carrier part when the component is soldered in.

Furthermore, an example of a suitable solder is a palladium-indium solder, the constituents of which are intermixed at a comparatively low initial temperature of approximately 200° C., and which has an advantageously high melting point of in excess of 660° C. after intermixing.

Such a connection may be produced for example by applying an indium layer on the semiconductor layer and a palladium layer on the carrier and then joining together the carrier and the semiconductor layer under increased pressure at a temperature of approximately 200° C. or more.

It goes without saying that it is also possible for the palladium layer to be applied on the semiconductor layer and the indium layer to be applied on the carrier. Moreover, it is advantageous to provide further layers between the semiconductor layer and the metal layer, said further layers ensuring for example protection of the semiconductor layer or good adhesion. A layer sequence with a titanium layer on the semiconductor surface, then a palladium layer and an indium layer thereon is particularly advantageous in conjunction with a palladium layer on the carrier.

With regard to a low contact resistance and advantageous soldering properties, it is expedient to provide the semiconductor layer with a contact metallization on the side facing the carrier, prior to soldering onto the carrier. A platinum-gold metallization, for example, is suitable for this purpose.

In a further aspect of the invention, it is provided that the thermal expansion coefficient of the carrier $a_T$ is chosen in a manner coordinated with the thermal expansion coefficient of the semiconductor layer $a_{HL}$ and/or the thermal expansion coefficient of the substrate $a_S$ and also, if appropriate, the beam profile and the pulse length of the laser beam pulses. Generally, a coordination of the thermal expansion coefficients is to be understood to mean that their difference is so small that, in the temperature range that occurs during production or is provided in operation, no damage is produced at the semiconductor layer and the carrier. In particular, this makes it possible to significantly reduce strains between substrate, semiconductor layer and carrier during production. The risk of cracking in the carrier and in the semiconductor layer is thus greatly decreased.

It has been observed in this respect in the context of the invention that the spot profiles (intensity profiles) of the laser pulses used for stripping away the semiconductor layers are often revealed after the laser bombardment on the semiconductor surface. In the case where GaN semiconductor layers are stripped away, metallic gallium remains on the surface, for instance, after the dissociation of the GaN. The inventors' examinations furthermore revealed that cracks arise in the GaN material at the edges of the laser spots, which cracks, during further processing of the material, lead to the local flaking-away of the semiconductor layer from the underlying carrier.

It has now been found that primarily thermal effects are responsible for this. In order, in the case of a GaN semiconductor layer, for instance, to achieve a dissociation of the GaN, it is necessary locally to achieve temperatures of approximately 800° C. to 1000° C. in the semiconductor layer. If the energy density decreases greatly at the edge of the laser spot, then the temperatures required for stripping away can be reached within the laser spot, while the semiconductor material remains comparatively cold in the direct vicinity of the laser spot.

Although the temperatures reached at the GaN surface decrease significantly over the layer thickness of the semiconductor layer, temperatures of up to 400° C. are still reached at the carrier side of the semiconductor layer in the region of the laser spot. Consequently, tensile strains arise on account of the locally different temperatures in the laser spot and outside the spot both in the semiconductor layer and in the carrier on account of the generally different thermal expansion coefficients of the semiconductor material and the carrier material, and may lead to the observed formation of cracks in the semiconductor material at the laser spot edges.

During the further processing of such semiconductor layers provided with cracks, the problem arises, for example, that acid can creep along the cracks under the semiconductor layer and, for instance, destroys a bonding metallization there.

In the case of the invention, use is preferably made of special carrier materials that are adapted in terms of their thermal properties. In this case, two process steps, in particular, namely the bonding process and the laser irradiation are taken into account for the choice of the thermal expansion coefficient of the carrier $a_T$.

During the bonding process, the substrate with the semiconductor layer epitaxially coated thereon, together with the carrier, is heated in whole-area fashion to a temperature of typically approximately 400° C. and subsequently cooled down again gradually to room temperature. In this step, the strain balance of the layer assembly substrate/semiconductor layer/carrier is essentially determined by the substrate and the carrier. If the thermal expansion coefficients of substrate and carrier, $a_S$ and $a_T$, deviate too greatly from one another, then the layer assembly may buckle as it cools down. Cracks may also form in the carrier, so that the resulting chip no longer has sufficient stability.

This problem is illustrated by way of example in FIG. 7. In the case of the layer assembly 20 illustrated diagrammatically there, a GaN semiconductor layer 21 is grown on a sapphire substrate 22. That side of the semiconductor layer 21 which is remote from the substrate 22 is provided with a contact metallization 23. A bonding wafer is soldered as carrier 24 on the contact metallization 23 at a temperature of approximately 400° C.

If the thermal expansion coefficient $a_T$ of the carrier is significantly less than the thermal expansion coefficient $a_S$ of the sapphire substrate, then cracks 25 may form in the carrier 24 during this bonding step.

During the laser irradiation, the semiconductor material is locally heated within the laser spot to a temperature above the decomposition temperature of the semiconductor material, while the substrate material remains cold on account of its substantially lower absorption of the laser radiation. Since the laser irradiation eliminates the bond between the semiconductor material and the substrate by dissociation, the difference between the thermal expansion coefficients of semiconductor layer and carrier, $a_{HL}$ and $a_T$, determines the strain balance in the layer assembly. In the event of a large difference between $a_{HL}$ and $a_T$, tensile strains may arise, which may lead to cracking in the semiconductor material at the locations of the spot edges.

FIG. 8 elucidates the problem area once again for stripping away a GaN layer 21 from a sapphire substrate 22. When the layer assembly 20 is irradiated with short laser pulses 26 of an excimer laser, the laser radiation is absorbed in a region 27 of the GaN layer 21 near the boundary and generates temperatures of 800° C. to 1000° C. there. Temperatures of up to approximately 400° C. are still reached on that side of the semiconductor layer 21 which is remote from the substrate and in the adjoining region 28. The GaN layer 21 and the contact metallization 23 remain comparatively cold outside the laser spot. The temperature in the regions 29 and 30 which laterally directly adjoin the laser spot is typically significantly less than 300° C. In the event of greatly different thermal expansion coefficients between the GaN layer 21 and the material of the carrier 24 or the bonding wafer, cracks 31 may thus arise in the epitaxial GaN layer 21.

In order to avoid cracking in the carrier and in the epitaxial semiconductor layer, it is therefore necessary to choose a carrier material whose thermal expansion coefficient $a_T$ does not differ too greatly either from the thermal expansion coefficient of the substrate $a_S$ or from the thermal expansion coefficient of the semiconductor layer $a_{HL}$. The radiation profile and the pulse length of the laser radiation also influence the choice of a suitable thermal expansion coefficient $a_T$, as will be explained in even more detail further below.

A preferred refinement of the method according to the invention provides for the thermal expansion coefficient of the carrier $a_T$ to be chosen to be nearer to the thermal expansion coefficient of the semiconductor layer $a_{HL}$ than to the thermal expansion coefficient $a_S$ of the substrate. Such a choice enables the formation of cracks in the semiconductor layer to be effectively reduced or wholly avoided.

In this case it is expedient if the thermal expansion coefficient of the carrier $a_T$ differs from the thermal expansion coefficient $a_S$ of the substrate by 45% or less, preferably by 40% or less.

In particular, for a sapphire substrate having a thermal expansion coefficient of $$a(Al_2O_3)=7.5*10^{-6}K^{-1}$$

a carrier material is preferred whose thermal expansion coefficient $a_T$, although it lies below $a(Al_2O_3)$, is nevertheless greater than $4.125*10^{-6}K^{-1}$, in particular greater than $4.5*10^{-6}K^{-1}$.

With regard to the thermal properties of the semiconductor layer, it is advantageous if the thermal expansion coefficient of the carrier $a_T$ differs from the thermal expansion coefficient $a_{HL}$ of the semiconductor layer by 35% or less, preferably by 25% or less. In particular when stripping away a nitride compound semiconductor layer such as, for example, a GaN-based semiconductor layer having a thermal expansion coefficient of $$a(GaN)=4.3*10^{-6}K^{-1},$$

a carrier material is preferred whose thermal expansion coefficient $a_T$, although it is greater than $a(GaN)$, is nonetheless less than $5.8*10^{-6}K^{-1}$, in particular less than $5.6*10^{-6}K^{-1}$.

Consequently, a carrier having a thermal expansion coefficient of between $4.125*10^{-6}K^{-1}$ and $5.8*10^{-6}K^{-1}$, in particular between $4.5*10^{-6}K^{-1}$ and $5.6*10^{-6}K^{-1}$, is particularly well suited to the stripping-away of a nitride compound semiconductor layer, for instance a GaN or GaInN layer, from a sapphire substrate.

Given such a choice of thermal expansion coefficient $a_T$ a large pulse length of the laser beam pulses, in particular a pulse length of greater than 15 ns, can be chosen for the separation of the semiconductor layer from the substrate without resulting in cracking in the semiconductor layer.

In a particularly preferred refinement of the invention, the carrier contains molybdenum. The thermal expansion coefficient of molybdenum $$a(Mo)=5.21*10^{-6}K^{-1}$$

lies significantly nearer to a(GaN) than, for example, the thermal expansion coefficient of GaAs where $a(GaAs)=6.4*10^{-6}K^{-1}$. The abovementioned problem area of cracking during the laser bombardment is significantly reduced in the case of the layer assembly molybdenum bonding wafer/GaN semiconductor layer/sapphire substrate. Moreover, molybdenum is stable enough such that cracks do not arise during bonding or during cooling from the bonding temperature to room temperature.

In a further preferred refinement of the method according to the invention, the carrier contains an iron-nickel-cobalt alloy, which likewise has a favorable thermal expansion coefficient of $$a(Fe—Ni—Co)=5.1*10^{-6}K^{-1}$$

Tungsten having a thermal expansion coefficient of $$a(Wo)=4.7*10^{-6}K^{-1}$$

has also been found to be an advantageous material for the carrier. It is generally shown that the metallic carrier materials are scarcely sensitive to cracking on account of their toughness during the bonding process and during cooling to room temperature.

It is also possible within the scope of the invention, in the selection of the thermal expansion coefficient of the carrier, to permit a greater tolerance with regard to the thermal expansion coefficient of the semiconductor layer if shorter laser pulses are used. Thus, according to the invention, the thermal expansion coefficient of the carrier $a_T$ may differ from the thermal expansion coefficient $a_{HL}$ of the semiconductor layer by 35% or more if a small pulse length of the laser beam pulses, in particular a pulse length of less than approximately 15 ns, is chosen for the separation of the semiconductor layer from the substrate. This permits, in particular, the use of a GaAs bonding wafer where $a(GaAs)=6.4*10^{-6}K^{-1}$ with short pulse duration.

A preferred further development of the method according to the invention provides for the abovementioned carriers having an adapted thermal expansion coefficient to be used in the stripping method described above with a laser beam having a plateaulike beam profile. This also includes, in particular, the advantageous refinements described, such as the use of an excimer laser, for example with XeF, XeBr, XeCl, KrCl or KrF as laser-active medium, the formation of a rectangular or trapezoidal spatial radiation profile, the selection of an emission wavelength of between 200 nm and 400 nm, the downstream arrangement of suitable optical arrangements and/or a beam homogenizer or the subsequent irradiation of the substrate in a plurality of individual regions of the semiconductor layer.

Furthermore, as already described, prior to stripping, the semiconductor layer may be soldered onto the carrier by means of a gold-tin solder, preferably with a high proportion of gold of 65% by weight to 85% by weight, or by means of a palladium-indium solder, it optionally being possible for a metallization containing gold and/or platinum, for example, also to be applied to that side of the semiconductor layer which is remote from the substrate.

It has been found as a further advantage of the method according to the invention that the use of thermally adapted carriers also solves the problem of inadequate adhesion between semiconductor layer and carrier, which has been observed in the past for example in the case of epitaxial GaN layers in conjunction with GaAs bonding wafers as the carrier. The control of the strain balance in the entire layer assembly according to the present invention also includes the bonding metallization and thus provides an effective remedy with regard to the aforementioned problem area of adhesion.

The invention is suitable in particular for semiconductor layers containing a nitride compound semiconductor. Nitride compound semiconductors are for example nitride compounds of elements of the third and/or fifth main group of the Periodic Table, such as GaN, AlGaN, InGaN, AlInGaN, InN or AlN. In this case, the semiconductor layer may also comprise a plurality of individual layers of different nitride compound semiconductors. Thus, the semiconductor layer may have for example a conventional pn junction, a double heterostructure, a single quantum well structure (SQW structure) or a multiple quantum well structure (MQW structure). Such structures are known to the person skilled in the art and are therefore not explained in any greater detail at this point. Such structures are preferably used in optoelectronic components such as light emission diodes such as light-emitting diodes (LEDs) or laser diodes.

It should be noted that generally in the context of the invention, in particular for nitride compound semiconductors, a carrier is suitable which contains gallium arsenide, germanium, molybdenum, silicon or an alloy, for example based on iron, nickel and/or cobalt. Carriers based on the abovementioned advantageous materials molybdenum, tungsten or an iron-nickel-cobalt alloy are preferably used.

Examples of a suitable substrate for the epitaxial fabrication of nitride compound semiconductor layers are silicon, silicon carbide or aluminum oxide or sapphire substrates, sapphire substrates advantageously being transmissive to the laser radiation used for the separation of the semiconductor layer, in particular in the ultraviolet spectral range. This enables irradiation of the semiconductor layer through the substrate when stripping away the semiconductor layer.

The method according to the invention may advantageously be employed in the case of thin-film chips typically having a semiconductor layer with a thickness of less than approximately 50 µm. The thin-film chip may be for example an optoelectronic chip, in particular a radiation-generating chip such as a luminescence diode chip, for example.

BRIEF DESCRIPTION OF THE DRAWINGS

FIGS. 1a to 1e show a diagrammatic illustration of a first exemplary embodiment of a method according to the invention on the basis of five intermediate steps, FIGS. 2a and 2b respectively show a diagrammatic illustration of two variants of a second exemplary embodiment of a method according to the invention.

DETAILED DESCRIPTION OF THE DRAWINGS

Figure 2A:
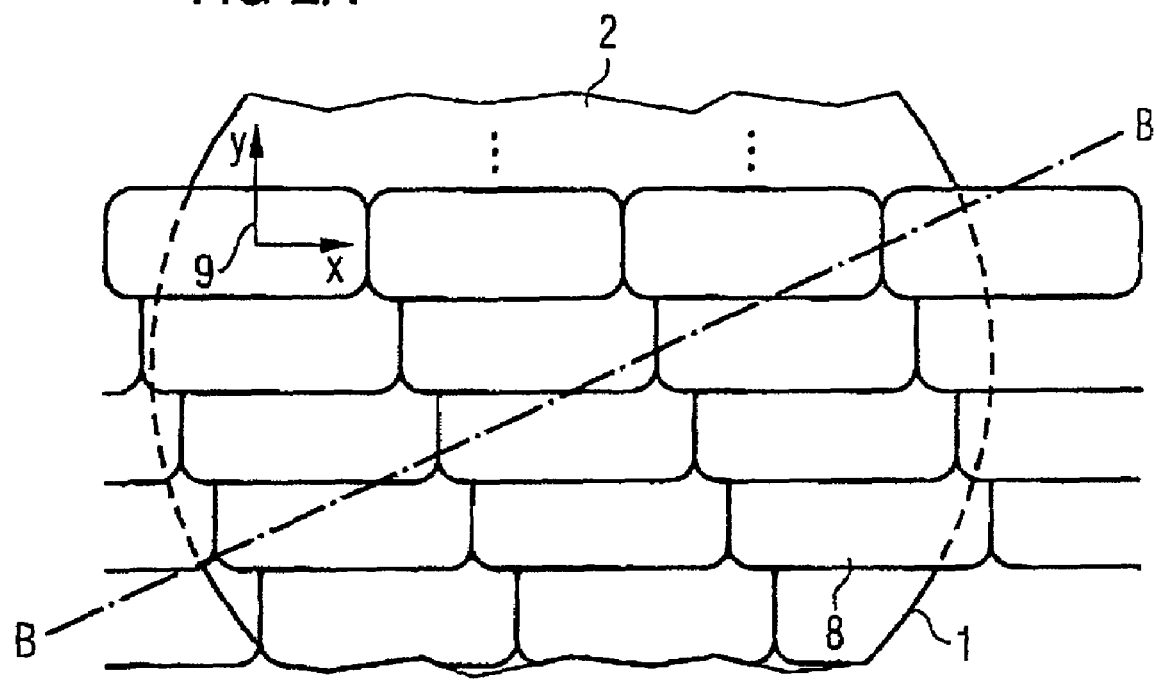

Identical or identically acting elements are provided with the same reference symbol in the Figures.

In the first step of the method illustrated in FIG. 1, FIG. 1a, a semiconductor layer 2 is applied to a substrate 1. This may be a nitride compound semiconductor layer, for example an InGaN layer, which is grown epitaxially onto a sapphire substrate. More widely, the semiconductor layer 2 may also comprise a plurality of individual layers which may contain for example GaN, AlN, AlGaN, InGaN, InN or InAlGaN and be grown successively onto the substrate 1.

In the next step, FIG. 1b, the semiconductor layer 2 is provided with a contact metallization 3 on the side remote from the substrate. The contact metallization 3 results in a low contact resistance between the semiconductor layer 2 and an electrical connection, for example a connecting wire, that is to be fitted in a later method step. Moreover, the contact metallization 3 improves the soldering properties of the semiconductor layer 2.

The contact metallization 3 may be vapor-deposited or sputtered on for example in the form of a thin gold- and/or platinum-containing layer.

Afterward, a carrier 4 is soldered onto the contact metallization 3, FIG. 1c. The solder 5 used is preferably a gold-containing solder, for example a gold-tin solder with a gold proportion of between 65% by weight and 85% by weight, preferably 75% by weight. Such a soldering connection is distinguished by a high thermal conductivity and a high stability under alternating temperature loads.

The soldering connection may be formed at a joining temperature of 375° C., a comparatively low joining pressure of less than 1.0 bar being necessary. This low joining pressure makes it possible, even in the case of very thin semiconductor layers, to effect a connection to the carrier 4 without mechanical damage to the semiconductor layer 2.

The carrier 4 used may be a GaAs wafer, for example, which has a similar thermal expansion coefficient to that of sapphire.

A carrier 4 in the form of a bonding wafer made of molybdenum is preferably provided. The thermal expansion coefficients of the bonding wafer a(Mo)=$5.21*10^{-6}K^{-1}$ and of the sapphire substrate a($Al_2O_3$)=$7.5*10^{-6}K^{-1}$ are relatively close together, so that thermally induced strains in the semiconductor layer 2 are advantageously kept low. Furthermore, molybdenum is sufficiently tough, so that cracks do not arise in the molybdenum bonding wafer during bonding and during cooling from the bonding temperature to room temperature.

Instead of a GaAs wafer a Ge wafer may also be used in the case of the invention. The thermal expansion coefficient of germanium is similar to that of GaAs, so that differences scarcely result in this regard. However, a Ge wafer has the advantage over a GaAs wafer that it can be sawn more easily, in which case, in particular, no arsenic-containing toxic sawing waste is obtained. Furthermore, Ge wafers are mechanically stabler. Thus, a sufficient stability is already achieved with a 200 µm thick Ge wafer for example, whereas the thickness of a corresponding GaAs wafer is greater than 600 µm. It is advantageous that it is also not necessary in this case for the Ge wafer to be thinned by grinding in a further method step. Finally, Ge wafers are generally significantly more cost-effective than GaAs wafers.

Preferably, a gold-containing solder or gold itself is used as solder in conjunction with a Ge wafer. This achieves a particularly fixed connection to the semiconductor layer. Use is made particularly preferably of a gold-vapor-deposited Ge wafer, which may optionally be provided with an AuSb surface layer.

In the subsequent step, FIG. 1*d*, the semiconductor layer 2 is irradiated through the substrate 1 with a laser beam 6 having a plateaulike beam profile 7. The radiation energy is predominantly absorbed in the semiconductor layer 2 and brings about a material decomposition at the interface between the semiconductor layer 2 and the substrate 1, so that the substrate 1 can subsequently be lifted off.

What is essential in the case of the invention is that the beam profile and the coupled-in beam power are dimensioned such that a high temperature that suffices for material decomposition arises locally at the interface between the substrate 1 and the semiconductor layer 2, which temperature falls over the layer thickness of the semiconductor layer to an extent such that the connection 5 between the carrier 4 and the semiconductor layer is not impaired, for example by melting.

The strong mechanical loads that occur on account of the material decomposition are advantageously taken up by the solder layer, so that even semiconductor layers having a thickness of a few micrometers can be stripped nondestructively from the substrate.

The transverse beam profile 7 of the laser beam 6 is likewise illustrated in FIG. 1*d*. The beam intensity along the line A-A is plotted. The beam profile 7 has a central region 17, in which the intensity is essentially constant. Said central region 17 is adjoined laterally by flank regions 18, in which the intensity falls steeply. Depending on the type of fall, the beam profile is like a trapezoid (linear fall) or a rectangle in the case of a very steep fall.

An XeF excimer laser is particularly suitable as the radiation source. On account of the high gain and the typical resonator geometry of excimer lasers, the spatial beam profile is plateaulike and therefore particularly suitable for the invention. Furthermore, the high pulse peak intensity of excimer lasers in a range of 1 kW to 100 MW and also the emission wavelength in the ultraviolet spectral range are advantageous in the case of the invention.

The laser radiation is focused by means of a suitable optical arrangement through the substrate onto the semiconductor layer 2, where it has a typical beam area of approximately 1 mm×2 mm or more. The intensity distribution within the beam area is largely homogeneous, an energy density of between 200 mJ/cm$^2$ and 800 mJ/cm$^2$ being achieved. This energy density in conjunction with a homogeneous intensity distribution enables the semiconductor layer to be separated from the substrate without any residues.

This has been demonstrated experimentally by way of example using an InGaN layer on a sapphire substrate. Specifically, the InGaN semiconductor layer was irradiated with a pulsed laser beam from an XeF excimer laser having a wavelength of 351 nm and a pulse duration of 25 ns. While the sapphire substrate is transparent to radiation having this wavelength, it is absorbed to a great extent in the InGaN semiconductor layer. A thin boundary layer at the junction with the substrate is heated by the energy input to temperatures of 800° C. to 1000° C. At this temperature, the semiconductor material decomposes at the laser spot to liberate nitrogen and the bond between the semiconductor layer 14 and the substrate 12 separates.

As an alternative, a comparable separation without any residues can be carried out using a KrF excimer laser. At approximately 248 nm, the emission wavelength lies further in the ultraviolet spectral range. In this case, even with larger beam cross sections having a dimensioning of 30 mm×10 mm, the energy density, which correspondingly lies between 150 mJ/cm$^2$ and 600 mJ/cm$^2$, preferably between 150 mJ/cm$^2$ and 450 mJ/cm$^2$, suffices for separating the semiconductor layer from the substrate without any residues. Furthermore, XeBr, XeCl and KrCl excimer lasers having an emission wavelength of approximately 282 nm, 308 nm and 222 nm, respectively, have proved to be suitable for the invention.

After irradiation with the laser beam, the substrate 1 can be lifted off, FIG. 1*e*, in which case the semiconductor layer 2 remains on the carrier 4 largely without any substrate residues and can be processed further.

FIG. 2*a* shows a second exemplary embodiment of a method according to the invention. In contrast to the method illustrated in FIG. 1, in this case individual regions 8 of the semiconductor layer 2 are successively exposed to the laser beam. The approximately rectangular individual regions 8 are arranged in area-filling and slightly overlapping fashion. In this case, the overlap serves to compensate for the drop in intensity in the edge regions 18 of the beam profile 7. The individual regions are furthermore arranged in matrix-like fashion, an offset of the matrix rows with respect to one another being advantageous with regard to an intensity distribution that is as homogeneous as possible. An alternative arrangement of the individual regions 8 is illustrated diagrammatically in FIG. 2*b*.

Figure 2B:
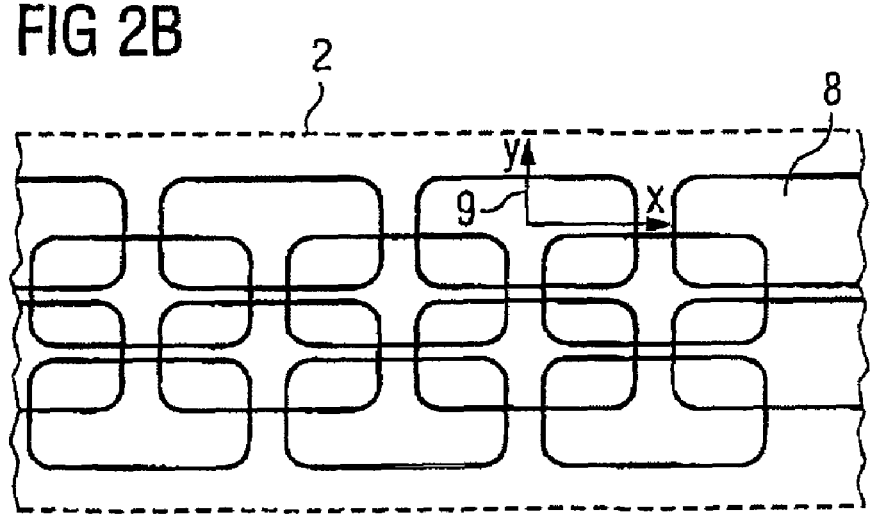
Figure 3A:
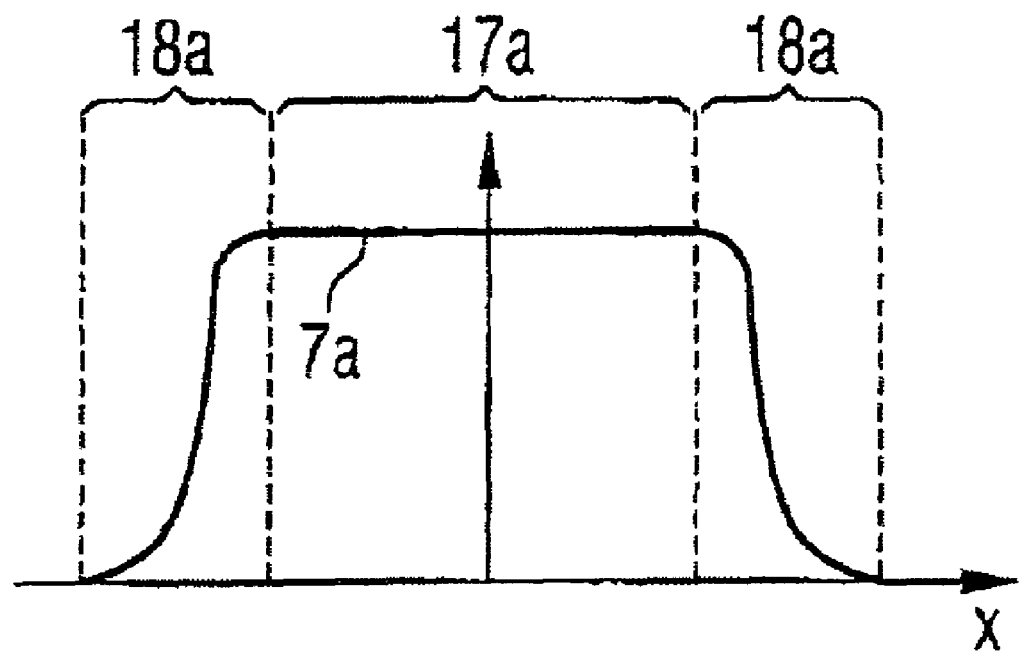
FIGS. 3a and 3b show a diagrammatic illustration of a beam profile of the laser beam in the case of the method shown in FIG. 2a, FIG. 4 shows a diagrammatic illustration of the resulting intensity distribution in the case of the method illustrated in FIG. 2a, FIG. 5 shows a diagrammatic illustration of a third exemplary embodiment of a method according to the invention.
Figure 3B:
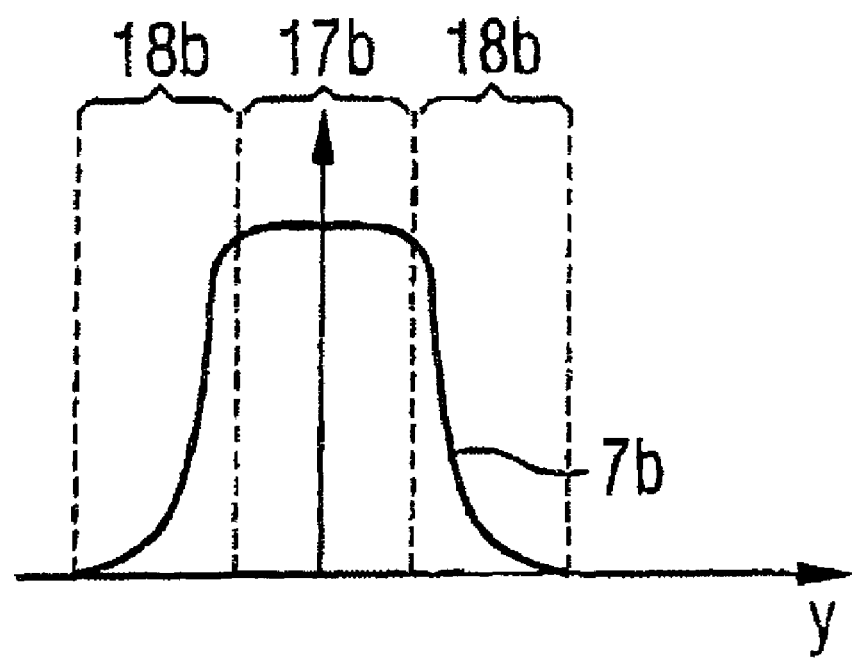

The beam profile of the laser beam within the individual region 8 is illustrated in FIGS. 3*a* and 3*b*. In FIG. 3*a*, the intensity is plotted along the X axis of the coordinate system 9 of axes depicted in FIGS. 2*a* and 2*b*; FIG. 3*b* shows the corresponding intensity profile along the Y axis. Both profiles are plateaulike and have a central region 17*a*, 17*b* adjoined by flanks 18*a*, 18*b* with a steep fall in intensity.

Figure 4:

The intensity distribution resulting from this in the case of the individual irradiation of the semiconductor layer as shown in FIG. 2*a* is illustrated in FIG. 4. The intensity along the line B-B integrated over the entire irradiation time is plotted. The result is a largely homogeneous, virtually constant intensity profile over the entire area of the semiconductor layer 2, which enables the semiconductor layer 2 to be separated from the substrate 1 in a manner free of residues.

By contrast, FIG. 6 illustrates a corresponding method according to the prior art with regard to the beam profile. The laser used in this case, for example a frequency-tripled Nd:YAG laser, has an approximately circular beam area with a Gaussian beam profile 15.

Figure 6A:
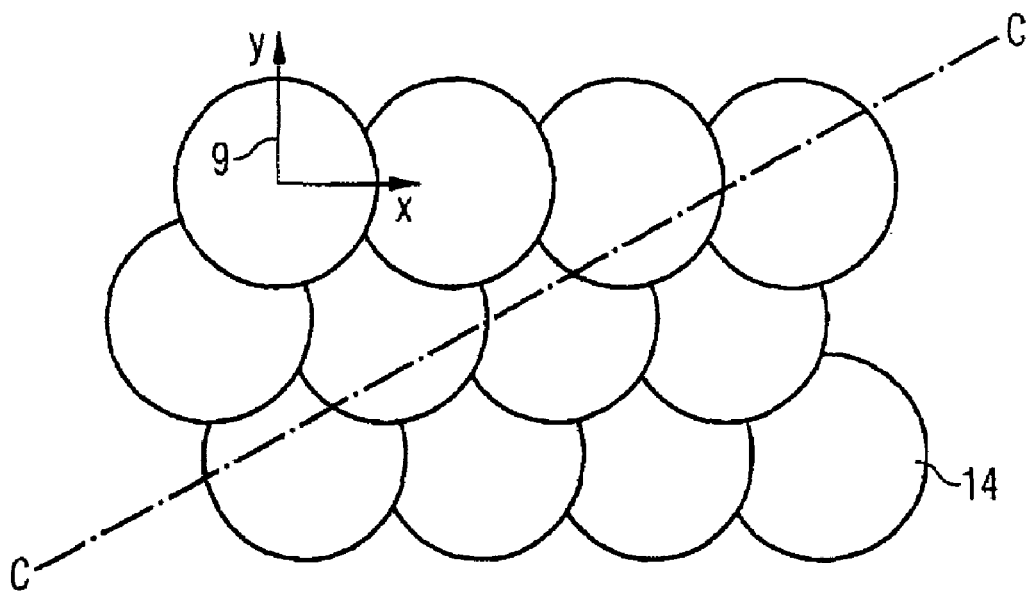
FIGS. 6a to 6c show a diagrammatic illustration of a production method with the use of Gaussian intensity distributions.

A gridlike arrangement—corresponding to FIG. 2*a* or 2*b*—of successively irradiated regions 14 of a semiconductor layer is shown in FIG. 6*a*.

Figure 6B:
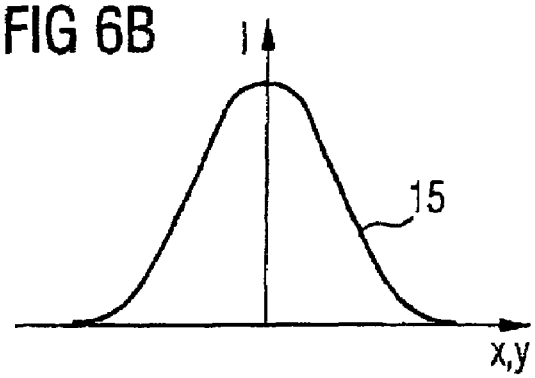

The associated beam profile 15, i.e. the intensity profile along the X axis and the Y axis of the coordinate system 9 of axes, is illustrated in FIG. 6*b*. On account of a rotationally symmetrical intensity distribution, which also results in the circular beam area, the intensity profile along the two axes is approximately identical. The intensity profile corresponds to a Gaussian curve with maximum intensity at the origin of the coordinate system 9 of axes.

In order to attain the decomposition threshold with such a laser beam, it is generally necessary to focus the beam. In this case, the decomposition threshold is exceeded in the beam center, while the energy density is too low for a material decomposition in the edge regions. An approximately constant intensity distribution, as illustrated in FIG. 4, cannot be achieved in the case of a gridlike irradiation of a semiconductor layer in accordance with FIG. 6*a*. The intensity variation over the entire beam profile and in particular the pronounced intensity maximum in the beam center leads to numerous intensity maxima and minima on the semiconductor layer.

Figure 6C:
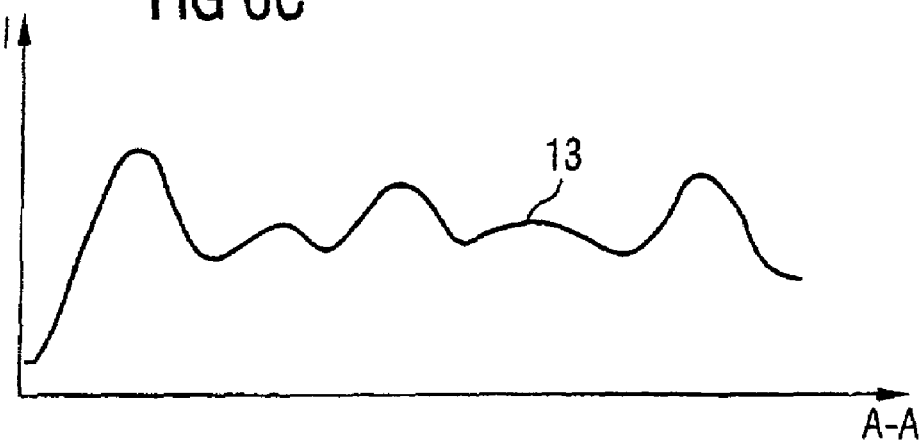
Figure 7:
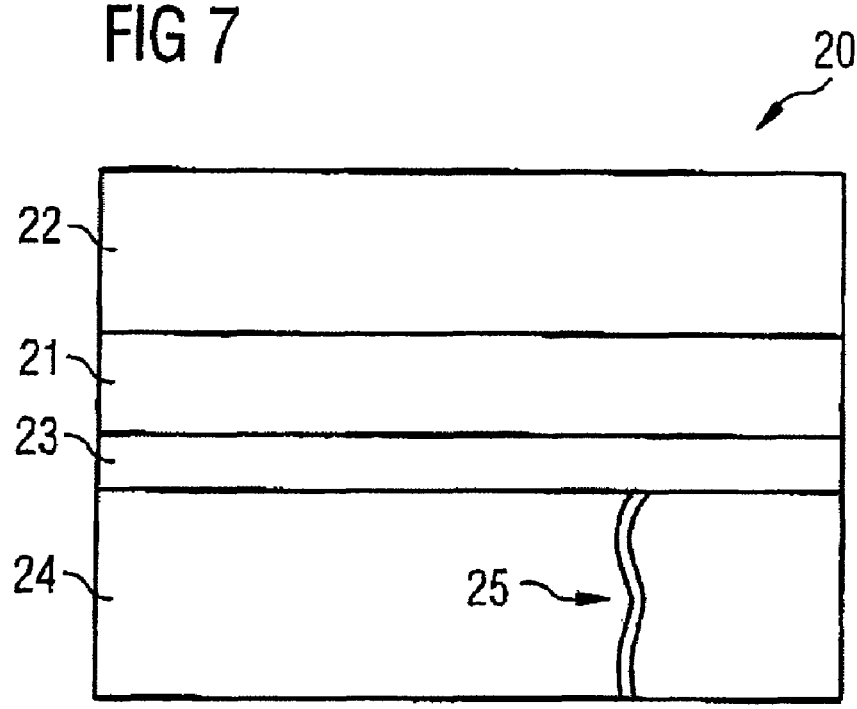
FIG. 7 shows a diagrammatic illustration for elucidating the arising of cracks in the carrier.
Figure 8:
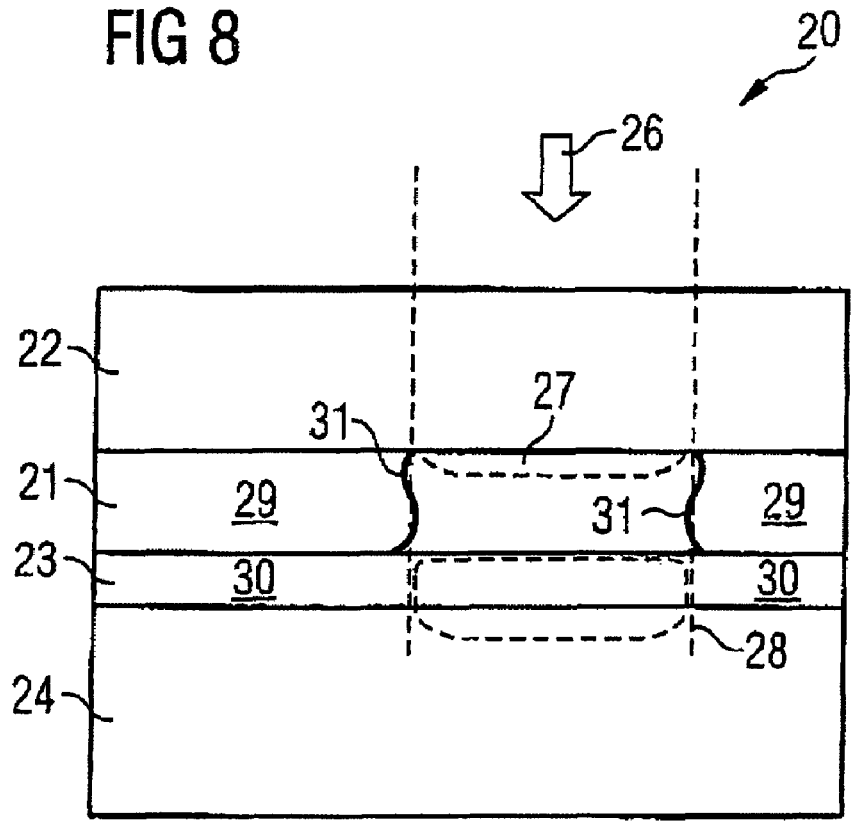
FIG. 8 shows a diagrammatic illustration for elucidating the arising of cracks in the semiconductor layer.

An exemplary profile 13 of the intensity along the line C-C—shown in FIG. 6a—integrated over the entire irradiation time is illustrated in FIG. 6c. The variation of the intensity profile 13 leads to a nonuniform material decomposition, in which case the decomposition threshold may be undershot in particular in the minima of the intensity distribution.

The semiconductor material is preserved at the locations at which the energy density necessary for the material decomposition is not attained. On account of the material decomposition in the vicinity of these locations, if appropriate with evolution of gas such as nitrogen, for example, in the case of nitride compound semiconductors, a high pressure may arise locally and wrench particles out of the substrate. These particles may adhere to the locations where the semiconductor material has not decomposed, so that ultimately substrate residues remain on the stripped semiconductor layer.

In order to prevent that, the beam intensity could be increased further in the case of conventional methods. However, there would then be the risk of damage to the semiconductor layer due to overheating at the locations of the intensity maxima.

Figure 5:
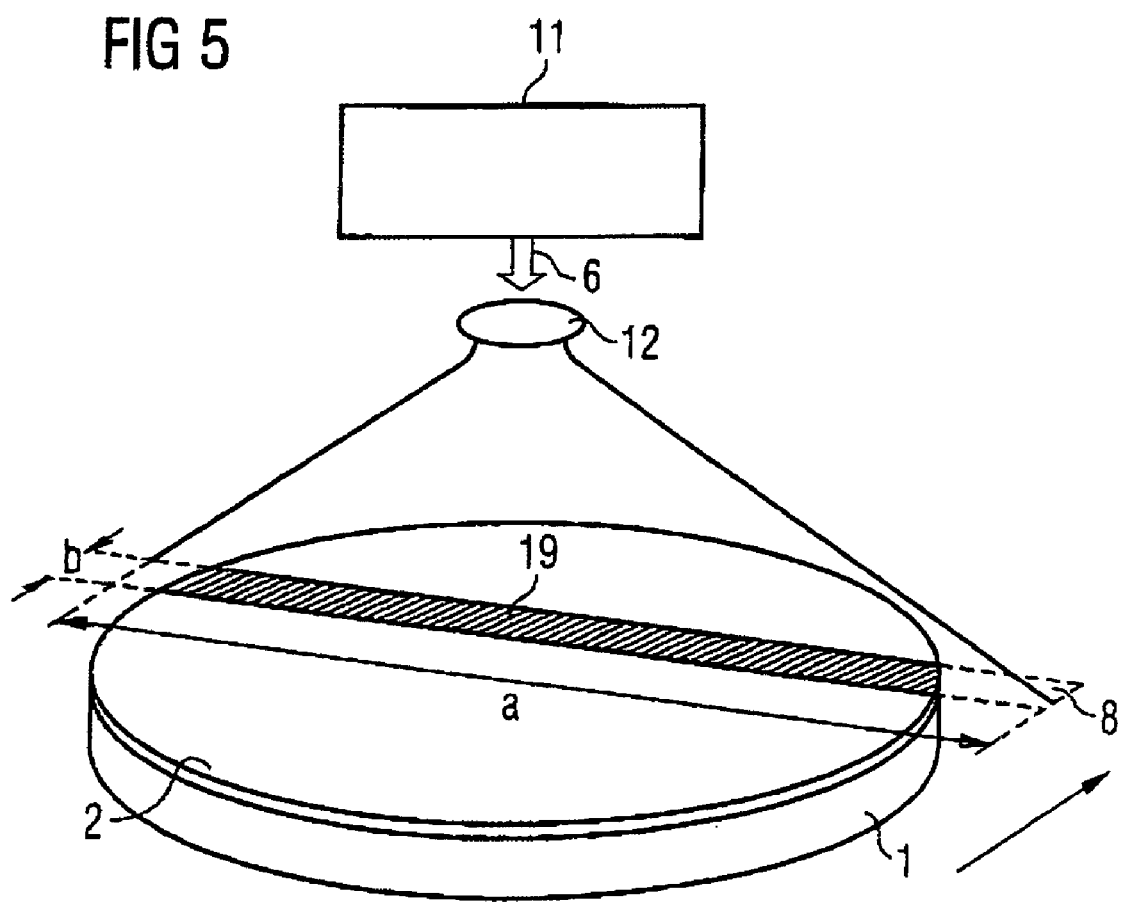

FIG. 5 illustrates a third exemplary embodiment of a method according to the invention. In contrast to the method shown in FIGS. 1 and 2, the laser beam is in this case imaged onto the semiconductor layer 2 in such a way that a striplike beam area 19 arises. In this case, the beam area 19 has a longitudinal dimension a and a transverse dimension b, the longitudinal dimension a being significantly greater than the transverse dimension b. In the case of an excimer laser 11, a corresponding beam area may be formed for example by means of a suitable mask optical arrangement 12. The longitudinal dimension a is preferably greater than a corresponding dimension of the semiconductor layer 2, so that the semiconductor layer 2 is completely irradiated in this direction. In this case, the fall in intensity in the flank regions 18 of the beam profile does not affect the separation method, since the flank regions 18 lie outside the semiconductor layer 2.

The semiconductor layer 2 is moved during irradiation in the direction of the transverse dimension b so that the entire semiconductor layer 2 is irradiated uniformly. Given a pulsed laser with a sufficiently short pulse duration, typically in the nanoseconds range, this once again results in a progressive irradiation of striplike individual areas on the semiconductor layer 2, since the semiconductor layer 2 is essentially moved further between the laser pulses and the irradiation is effected instantly relative to this movement.

It goes without saying that the explanation of the invention on the basis of the exemplary embodiments is not to be understood as a restriction of the invention thereto. Rather, individual aspects of the exemplary embodiments can be combined largely freely within the scope of the invention. A method for producing a semiconductor component, in particular a thin-film component, a semiconductor layer being separated from a substrate by irradiation with a laser beam having a plateaulike spatial beam profile. Furthermore, the semiconductor layer, prior to separation, is applied to a carrier with an adapted thermal expansion coefficient. The method is suitable in particular for semiconductor layers containing a nitride compound semiconductor.

The scope of protection of the invention is not restricted by the description of the invention on the basis of the exemplary embodiments. In fact, the invention covers any new feature as well as any combination of features, in particular including any combination of features in the patent claims, even if this combination is not explicitly stated in the patent claims or in the examples.

The invention claimed is:

1. A method for producing a semiconductor component, comprising:
   separating a semiconductor layer from a substrate by irradiation with a laser beam,
   prior to separating the semiconductor layer from the substrate, applying the semiconductor layer onto a carrier by a side remote from the substrate, and
   choosing the thermal expansion coefficient of the carrier $a_T$ in a manner coordinated with at least one of the beam profile and the pulse length of the laser beam pulses, and with at least one of the thermal expansion coefficient of the semiconductor layer $a_{HL}$ and the thermal expansion coefficient $a_S$ of the substrate, in order to reduce strains between substrate, semiconductor layer and carrier during production.

2. The method as claimed in claim 1, wherein the laser beam is pulsed.

3. The method as claimed in claim 1, wherein the thermal expansion coefficient of the carrier $a_T$ is chosen to be nearer to the thermal expansion coefficient of the semiconductor layer $a_{HL}$ than to the thermal expansion coefficient $a_S$ of the substrate.

4. The method as claimed in claim 1, wherein the thermal expansion coefficient of the carrier $a_T$ differs from the thermal expansion coefficient $a_S$ of the substrate by 45% or less.

5. The method as claimed in claim 1, wherein the thermal expansion coefficient of the carrier $a_T$ differs from the thermal expansion coefficient $a_{HL}$ of the semiconductor layer by 35% or less.

6. The method as claimed in claim 1, wherein the carrier has a thermal expansion coefficient of between approximately $4.3*10_{-6}K^{-1}$ and approximately $5.9*10^{-6}K^{-1}$.

7. The method as claimed in claim 1 wherein the carrier contains at least one of gallium arsenide, silicon, copper, iron, nickel and cobalt.

8. The method as claimed in claim 1, wherein the carrier contains molybdenum.

9. The method as claimed in claim 1, wherein the carrier contains an iron-nickel-cobalt alloy.

10. The method as claimed in claim 1, wherein the carrier contains tungsten.

11. The method as claimed in claim 1, wherein the carrier contains germanium.

12. The method as claimed in claim 2, wherein a pulse length of greater than 15 ns of the laser beam pulses is chosen for the separation of the semiconductor layer from the substrate.

13. The method as claimed in claim 1, wherein the thermal expansion coefficient of the carrier $a_T$ differs from the thermal expansion coefficient $a_{HL}$ of the semiconductor layer by 35% or more, and in which a small pulse length of the laser beam pulses is chosen for the separation of the semiconductor layer from the substrate.

14. The method as claimed in claim 1, wherein the semiconductor layer is soldered onto the carrier by means of a solder containing at least one of gold and tin or at least one of palladium and indium.

15. The method as claimed in claim 1, wherein before the semiconductor layer is connected to the carrier, a metallization is applied to that side of the semiconductor layer which is remote from the substrate.

16. The method as claimed in claim 15, wherein the metallization contains at least one of gold and platinum.

17. The method as claimed in claim 1, wherein the semiconductor layer comprises a plurality of individual layers.

18. The method as claimed in claim 17, wherein the semiconductor layer or at least one of the individual layers contains a nitride compound semiconductor.

19. The method as claimed in claim 18, wherein the nitride compound semiconductor is a nitride compound of elements at least one of the third and fifth main group.

20. The method as claimed in claim 18, wherein the semiconductor layer or at least one of the individual layers contains $In_xAl_yGa_{1-x-y}N$ where $0 \leq x \leq 1$, $0 \leq y \leq 1$ and $x+y \leq 1$.

21. The method as claimed in claim 1, wherein the substrate contains silicon, silicon carbide, aluminum oxide, or sapphire.

22. The method as claimed in claim 1, wherein the semiconductor layer is separated from the substrate by means of a an excimer laser.

23. The method as claimed in claim 1, wherein the semiconductor layer is applied to the substrate by means of an epitaxy method.

24. The method as claimed in claim 1, wherein the semiconductor layer has a thickness which is less than or equal to 50 μm.

25. The method as claimed in claim 1, wherein the semiconductor component is a thin-film component and the substrate is at least partly removed from the grown-on semiconductor layer after the semiconductor layer has been grown on.

26. The method as claimed in claim 1, wherein the semiconductor component is a luminescence diode.

27. The method as claimed in claim 4, wherein the thermal expansion coefficient of the carrier $a_T$ differs from the thermal expansion coefficient $a_S$ of the substrate by 40% or less.

28. The method as claimed in claim 5, wherein the thermal expansion coefficient of the carrier $a_T$ differs from the thermal expansion coefficient $a_{HL}$ of the semiconductor layer by 25% or less.

29. The method as claimed in claim 6, wherein the carrier has a thermal expansion coefficient of between approximately $4.6*10^{-6} K^{-1}$ and approximately $5.3*10^{-6} K^{-1}$.

30. The method as claimed in claim 1, wherein a pulse length of the laser beam pulses of less than approximately 15 ns is chosen for the separation of the semiconductor layer from the substrate.

31. The method as claimed in claim 20, wherein the semiconductor layer or at least one of the individual layers contains GaN, AlGaN, InGaN, AlInGaN, AlN or InN.

* * * * *

UNITED STATES PATENT AND TRADEMARK OFFICE
CERTIFICATE OF CORRECTION

PATENT NO. : 7,588,998 B2
APPLICATION NO. : 10/503042
DATED : September 15, 2009
INVENTOR(S) : Michael Fehrer It is certified that error appears in the above-identified patent and that said Letters Patent is hereby corrected as shown below:

Please correct the name of the Assignee on the title page of said Letters Patent as follows:

Title Page
--(73) Assignee: Osram Opto Semiconductors GmbH, Regensburg (DE)--

Claim 6 at column 14, lines 31-33 should read as follows:

--6. The method as claimed in claim 1, wherein the carrier has a thermal expansion coefficient of between approximately $\underline{4.3*10^{-6}K^{-1}}$ ~~4.3*10₋₆K⁻¹~~ and approximately $5.9*10^{-6}K^{-1}$.--

Claim 29 at column 16, lines 12-14 should read as follows:

--29. The method as claimed in claim 6, wherein the carrier has a thermal expansion coefficient of between approximately $\underline{4.6*10^{-6}K^{-1}}$ ~~4.6*10₋₆K⁻¹~~ and approximately $5.3*10^{-6}K^{-1}$.--

Signed and Sealed this
Eighth Day of March, 2011

David J. Kappos
*Director of the United States Patent and Trademark Office*